US009960028B2

(12) United States Patent
Ouyang et al.

(10) Patent No.: US 9,960,028 B2
(45) Date of Patent: May 1, 2018

(54) SYSTEMS AND METHODS FOR ANALYZING A SAMPLE FROM A SURFACE

(71) Applicant: Purdue Research Foundation, West Lafayette, IN (US)

(72) Inventors: Zheng Ouyang, West Lafayette, IN (US); Xiao Wang, West Lafayette, IN (US); Xiaoyu Zhou, Beijing (CN)

(73) Assignee: Purdue Research Foundation, West Lafayette, IN (US)

( * ) Notice: Subject to any disclaimer, the term of this patent is extended or adjusted under 35 U.S.C. 154(b) by 0 days. days.

(21) Appl. No.: 15/318,846

(22) PCT Filed: Jun. 16, 2015

(86) PCT No.: PCT/US2015/035935
§ 371 (c)(1),
(2) Date: Dec. 14, 2016

(87) PCT Pub. No.: WO2015/195607
PCT Pub. Date: Dec. 23, 2015

(65) Prior Publication Data

US 2017/0140912 A1 May 18, 2017

Related U.S. Application Data

(60) Provisional application No. 62/012,878, filed on Jun. 16, 2014.

(51) Int. Cl.
*H01J 37/04* (2006.01)
*H01J 49/04* (2006.01)
(Continued)

(52) U.S. Cl.
CPC .......... *H01J 49/04* (2013.01); *H01J 49/0013* (2013.01); *H01J 49/0468* (2013.01); *H01J 49/24* (2013.01)

(58) Field of Classification Search
CPC .............................. H01J 49/04; H01J 49/0404
See application file for complete search history.

(56) References Cited

U.S. PATENT DOCUMENTS 5,504,327 A * 4/1996 Sproch .................. H01J 49/165 250/281
7,767,959 B1 * 8/2010 Freidhoff ............ H01J 49/0018 250/287

(Continued)

OTHER PUBLICATIONS

International Preliminary Report on Patentability, dated Dec. 29, 2016 in PCT/US2015/035935.

(Continued)

*Primary Examiner* — Jason McCormack
*Assistant Examiner* — Sean Luck
(74) *Attorney, Agent, or Firm* — Brown Rudnick LLP; Adam M. Schoen

(57) ABSTRACT

The invention generally relates to systems and methods for analyzing a sample from a surface. In certain aspects, the invention provides systems that include a sample introduction member that has an inlet, an outlet, and an opening along a wall of the sample introduction member. The sample introduction member may be configured such that the opening couples with a surface that includes a sample in a manner in which molecules of the sample enter the sample introduction member via the opening and exit the sample introduction member via the outlet. A mass spectrometer is configured to receive the molecules of the sample.

20 Claims, 15 Drawing Sheets

(51) Int. Cl.
*H01J 49/24* (2006.01)
*H01J 49/00* (2006.01)

(56) References Cited

U.S. PATENT DOCUMENTS 8,304,718 B2 * 11/2012 Ouyang .............. H01J 49/0495 250/281
8,525,109 B2 * 9/2013 Musselman ............. H01J 49/06 250/251
8,704,167 B2 * 4/2014 Cooks ...................... C12Q 1/04 250/281
2005/0230635 A1 * 10/2005 Takats ................... H01J 49/142 250/424
2007/0205362 A1 * 9/2007 Musselman ........ G01N 30/7293 250/288
2010/0301209 A1 * 12/2010 Ouyang .............. H01J 49/0495 250/288
2011/0101216 A1 * 5/2011 Musselman ......... H01J 49/0404 250/282
2011/0127421 A1 * 6/2011 Finlay .................... G01N 30/72 250/283
2011/0220784 A1 * 9/2011 Roach ................. H01J 49/0404 250/282
2012/0156712 A1 * 6/2012 Takats ...................... G01N 1/02 435/29

OTHER PUBLICATIONS

International Search Report, dated Sep. 15, 2015 in PCT/US2015/035935.

Written Opinion of the ISA, dated Sep. 15, 2015 in PCT/US2015/035935.

* cited by examiner

SYSTEMS AND METHODS FOR ANALYZING A SAMPLE FROM A SURFACE

CROSS-REFERENCE TO RELATED APPLICATIONS

The present application is a 35 U.S.C. § 371 national phase application of PCT/US2015/035935, filed Jun. 16, 2015, which is related to and claims the benefit of and priority to U.S. provisional patent application Ser. No. 62/012,878, filed Jun. 16, 2014, the content of which is incorporated by reference herein in its entirety.

GOVERNMENT SUPPORT

This invention was made with government support under CHE0847205 awarded by the National Science Foundation. The government has certain rights in the invention.

FIELD OF THE INVENTION

The invention generally relates to systems and methods for analyzing a sample from a surface.

BACKGROUND

Mass spectrometry (MS) is a very sensitive analytical method used for important research and for applications of analytical chemistry, such as life science. In the field of analytical chemistry, the demand for direct sampling under ambient conditions has increased. Direct sampling in the ambient environment (in situ) provides a sample analysis approach in which there is no intrinsic requirement for sample preparation, which allows real-time, on-site analysis of samples, saving time and resources.

To achieve direct sampling in an ambient environment, the sample must be efficiently transferred to the mass spectrometer because the sensitivity of mass analysis is highly dependent on the efficiencies of sample introduction to the mass spectrometer. For miniature mass spectrometry systems particularly, it is highly desirable to maximize the amount of the sample that can be introduced to the mass spectrometer.

A problem with sample introduction is that an MS inlet is very small, typically smaller than 700 μm, due to the fact that a vacuum must be maintained inside a manifold where ions are mass analyzed. Accordingly, the intake of neutral molecules or ions from atmosphere by the MS inlet is relatively inefficient, which hampers direct sampling from an ambient environment.

SUMMARY

The invention provides sample introduction members that facilitate transfer of neutral molecules or ions of a sample from an ambient environment to an inlet of a mass spectrometer. Sample introduction members of the invention are able to capture neutral molecules or ions of the sample that are emitted from the sample and transfer those molecules or ions to the inlet of a mass spectrometer. In that manner, sample introduction members of the invention increase the efficiency of the transfer of neutral molecules or ions into a mass spectrometer, thereby increasing the sensitivity of mass analysis. Sample introduction members of the invention can be coupled with discontinuous sample introduction interfaces, further increasing the transfer efficiency of neutral molecules or ions into the mass spectrometer.

In certain aspects, the invention provides systems for analyzing a sample that include a sample introduction member that has an inlet, an outlet, and an opening along a wall of the sample introduction member. The sample introduction member may be configured such that the opening couples with a surface that includes a sample in a manner in which molecules of the sample enter the sample introduction member via the opening and exit the sample introduction member via the outlet. A mass spectrometer may be configured to receive the molecules of the sample.

In certain embodiments, the sample introduction member includes a tube, such as a metal tube. The tube may include a central portion, a proximal portion, and a distal portion. The central portion may include the opening along the wall and the proximal and distal portions are bent with respect to the central portion. Typically, although not required, the opening along the wall is along a bottom of the central portion. The opening may be in other areas of the central portion, such as along one of the side walls or along a top of the central portion. Alternatively, the opening can be along the proximal or distal portion. In certain embodiments, the sample introduction member includes more than one opening. The multiple openings can be along the same portion of the sample introduction member (e.g., multiple openings along the central portion) or the multiple openings can be along different portions of the sample introduction member (e.g., one or more openings along the central portion and one or more openings along the proximal portion and/or the distal portion). In certain embodiments, the portion of the sample introduction member that includes the opening is also flat so that the sample introduction member better interfaces with a surface that includes a sample. For example, if the opening is along a bottom wall of the central portion, then the bottom wall of the central portion is flat.

In certain embodiments, the sample introduction member further includes a heating element. For example, a heating coil may be wrapped around the proximal portion of the sample introduction member so as to heat air or other gas/vapor that is introduced into the sample introduction member. In certain embodiments, a gas or vapor injection apparatus couples to the inlet of the sample introduction member.

Another aspect of the invention provides systems that include a sample introduction member configured to receive a probe that includes a sample and an outlet through which molecules of the sample flow upon being released from the probe. A heating element is operably coupled to the sample introduction member (e.g., a coil that wraps around the sample introduction member), and a mass spectrometer is configured to receive the molecules of the sample. In certain embodiments, the sample introduction member tapers to the outlet. Any type of probe can be interfaced with the sample introduction member. An exemplary probe is a that includes a cotton tip. In such embodiments, the sample introduction member is configured to receive the cotton tip.

Sample introduction members of the invention may be interfaced with any type of mass spectrometer, such as a standard bench-top mass spectrometer or a miniature mass spectrometer. In certain embodiments, the mass spectrometer includes an ionization source within a vacuum chamber of the mass spectrometer. In other embodiments, a discontinuous interface is positioned between the outlet and the mass spectrometer. A system set-up in which the mass spectrometer includes an ionization source within a vacuum chamber of the mass spectrometer, and a discontinuous interface is positioned between the outlet and the mass spectrometer is described for example in Ouyang et al. (U.S. Pat. No. 8,785,846), the content of which is incorporated by reference herein in its entirety. The flow rate of the sample introduced with a discontinuous interface can be much higher than that allowed with a conventional continuous atmospheric pressure interface. The pressure variation associated with the discontinuous interface operation may be used to turn on and off the synchronized discharge ionization. Since sample ions or molecules can be transferred directly to the ion trap mass analyzer without a barrier for maintaining pressure differences, high sensitivity in sample analysis is enhanced.

DETAILED DESCRIPTION

The invention generally relates to systems and methods for analyzing a sample from a surface. Particularly, different sample introduction members are described that capture neutral molecules or ions released from a sample and facilitate the transfer of those molecules or ions into a mass spectrometer.

Figure 1:
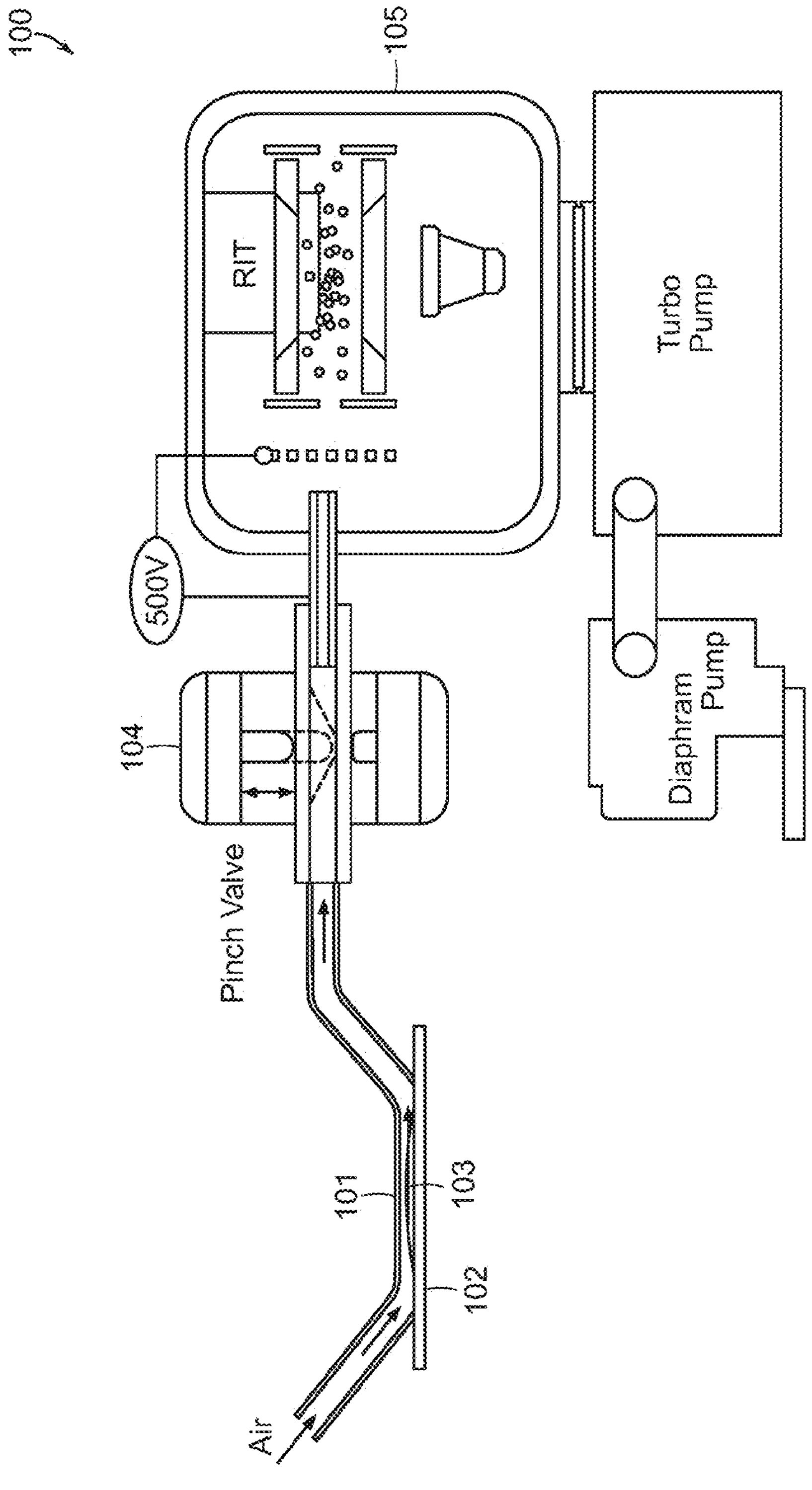
FIG. 1 illustrates an embodiment of a system of the invention with a sample introduction member.

An exemplary system including an exemplary sample introduction member is shown in FIG. 1. That figure shows a system 100, that includes a sample introduction member 101, coupled to a discontinuous interface 104, which is coupled to a mass spectrometer 105. The discontinuous interface 104 is optional, and in certain embodiments, sample introduction member 101 is coupled directly to mass spectrometer 105. Sample introduction member 101 is configured to interact with a surface, such as surface 102, which includes a sample 103.

The sample introduction member 101 is generally configured to allow for production of a laminar flow within it and sample introduction member 101 facilitates transfer of molecules or ions of a sample into mass spectrometer 105. Exemplary sample introduction members include tubes, capillaries, covered channels, open channels, and others. In a particular embodiment, the sample introduction member is a tube. The sample introduction member 101 may be composed of rigid material, such as metal or glass, or may be composed of flexible material such as plastics, rubbers, or polymers. An exemplary flexible material is TYGON tubing.

Figure 2:
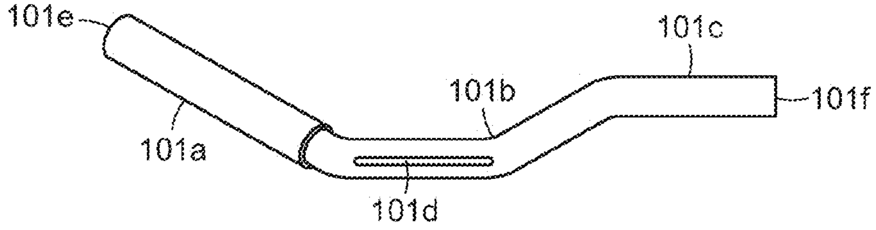
FIG. 2 illustrates details of the sample introduction member in FIG. 1.

FIG. 2 shows a side view of sample introduction member 101. Sample introduction member 101 includes proximal portion 101*a*, central portion 101*b*, and distal portion 101*c*. In this exemplary embodiment, the proximal portion 101*a* and the distal portion 101*c* are bent with respect to central portion 101*b*. The skilled artisan will recognize that this is only an exemplary embodiment and that neither proximal portion 101*a* nor distal portion 101*c* are required to be bent with respect to central portion 101*c*. For example, in certain embodiments, neither proximal portion 101*a* nor distal portion 101*c* are bent with respect to central portion 101*c*, i.e., sample introduction member 101 is straight. In other embodiments, the proximal portion 101*a* is bent with respect to the central portion 101*b*, while distal portion 101*c* is straight with respect to central portion 101*b*. In other embodiments, the distal portion 101*c* is bent with respect to the central portion 101*b*, while proximal portion 101*a* is straight with respect to central portion 101*b*. Additionally, the proximal portion 101*a* and the distal portion 101*c* do not need to be bent up with respect to central portion 101*b*, as shown in FIGS. 1-2. Either or both the proximal portion 101*a* and the distal portion 101*c* can be bent down with respect to the central portion 101*b*. Alternatively, one portion can be bent up with the other is bent down, such as the proximal portion 101*a* being bent up with respect to the central portion 101*b* and the distal portion 101*c* being bent down with respect to the central portion 101*b*, or vice versa. Additionally, the skilled artisan will appreciate that the angle of the bend shown in FIGS. 1-2 for each of the proximal and distal portions is exemplary, and any angle of bend for the proximal or distal portions with respect to the central portion is within the scope of the invention.

Sample introduction member 101 may have any length, such as from 5 mm in length up to 10 meters in length, and the length chosen will depend on environmental factors, such as the distance of the sample from the mass spectrometer system. Exemplary lengths include 5 mm, 6 mm, 7 mm, 8 mm, 9 mm, 10 mm, 15 mm, 20 mm, 25 mm, 30 mm, 35 mm, 40 mm, 45 mm, 50 mm, 60 mm, 70 mm 80 mm, 90 mm, 100 mm, 500 mm, 1 m, etc. The internal diameter of sample introduction member 101 will depend on environmental factors, such as the distance of the sample from the mass spectrometer system. Exemplary internal diameters start at 0.25 mm. Exemplary internal diameters include 0.25 mm, 0.3 mm, 0.35 mm, 0.4 mm, 0.45 mm, 0.5 mm, 0.55 mm, 0.6 mm, 0.65 mm, 0.7 mm, 0.75 mm, 0.8 mm, 0.85 mm, 0.9 mm, 0.95 mm, 1 mm, 2 mm, 3 mm 4 mm, 5 mm, 10 mm, 20 mm, 30 mm, 40 mm, 50 mm, 100 mm, etc.

The proximal portion 101*a* includes inlet 101*e* and the distal portion 101*c* includes outlet 101*f*. The inlet 101*e* can be coupled to another type of device, such as a gas generating device, which will be described in more detail below. Alternatively, inlet 101*e* does not need to be coupled to any other device and can simply receive a gas from the surrounding environment, such as air. That is exemplified in FIG. 1, which shows inlet 101*e* of sample introduction member 101 receiving air from the surrounding environment. The outlet 101*f* couples the sample introduction member 101, directly or indirectly, to the mass spectrometer 105. For example, FIG. 1 illustrates an indirect coupling, in which outlet 101*f* of sample introduction member 101 couples indirectly to mass spectrometer 105 via a discontinuous interface 104. In alternative embodiments, outlet 101*f* of sample introduction member 101 couples directly to mass spectrometer 105 without an intervening discontinuous interface 104.

Sample introduction member 101 includes an opening 101*d* in one of its walls. As shown in FIG. 1, the sample introduction member 101 is configured such that the opening 101*d* couples with the surface 102 that includes the sample 103. Molecules or ions of the sample 103 enter the sample introduction member via the opening 101*d*. Air enters the sample introduction member 101 via inlet 101*e* and interacts with the molecules or ions now within the sample introduction member 101. The molecules or ions exit then sample introduction member 101 via the outlet 101*f* and then directly or indirectly enter the mass spectrometer 105, optionally first passing through discontinuous interface 104. If it is ions that enter the mass spectrometer 105, then the ions are immediately analyzed. If it is neutral molecules that enter the mass spectrometer 105, then the neutral molecules are ionized within the mass spectrometer and then analyzed, as described for example in Ouyang et al. (U.S. Pat. No. 8,785,846). When a discontinuous interface is used, the ionization of the neutral molecules can be synchronized with the opening and closing of the discontinuous interface as described for example in Ouyang et al. (U.S. Pat. No. 8,785,846).

The opening 101*d* can be any length and width. For example, the opening 101*d* may be from less than 1 mm up to 9 meters, depending on the length of the sample introduction member 101. Exemplary lengths include less than 1 mm, 1 mm, 2 mm, 3 mm, 4 mm, 5 mm, 6 mm, 7 mm, 8 mm, 9 mm, 10 mm, 15 mm, 20 mm, 30 mm, 40 mm, 50 mm, 60 mm, 70 mm, 80 mm, 90 mm, 100 mm, etc. The width of the opening 101*d* may be from less than 1 mm up to 9 meters, depending on the length of the sample introduction member 101. Exemplary widths include 0.25 mm, 0.3 mm, 0.35 mm, 0.4 mm, 0.45 mm, 0.5 mm, 0.55 mm, 0.6 mm, 0.65 mm, 0.7 mm, 0.75 mm, 0.8 mm, 0.85 mm, 0.9 mm, 0.95 mm, 1 mm, 2 mm, 3 mm 4 mm, 5 mm, 10 mm, 20 mm, 30 mm 40 mm 50 mm, 100 mm, etc. less than 1 mm, 1 mm, 2 mm, 3 mm, 4 mm, 5 mm, 6 mm, 7 mm, 8 mm, 9 mm, 10 mm, 15 mm, 20 mm, 30 mm, 40 mm, 50 mm, 60 mm, 70 mm, 80 mm, 90 mm, 100 mm, etc.

The opening 101*d* can be positioned anywhere along sample introduction member 101. In the exemplary embodiment shown in FIGS. 1-2, the opening is positioned along a bottom of the central portion 101*b*. The opening 101*d* may be in other areas of the central portion 101*b*, such as along one of the side walls or along a top of the central portion 101*b*. Alternatively, the opening 101*d* can be along the proximal portion 101*a* or distal portion 101*c*. In certain embodiments, the sample introduction member 101 includes more than one opening. The multiple openings can be along the same portion of the sample introduction member 101 (e.g., multiple openings along the central portion) or the multiple openings can be along different portions of the sample introduction member 101 (e.g., one or more openings along the central portion and one or more openings along the proximal portion and/or the distal portion). In certain embodiments, the portion of the sample introduction member 101 that includes the opening 101*d* is also flat so that the sample introduction member 101 better interfaces with a surface that includes a sample. For example, if the opening 101*d* is along a bottom wall of the central portion 101*b*, then the bottom wall of the central portion 101*b* is flat (FIG. 2).

To ensure efficient transfer of ions or molecules over long distances (e.g., 5 cm or greater), systems of the invention can be configured as described for example in Ouyang et al. (U.S. Pat. No. 8,410,431), the content of which is incorporated by reference herein in its entirety. The gas flow within the sample introduction member 101 brings ions into a confined space and generates a laminar gas flow that focuses the molecules or ions and facilitates transfer of the molecules or ions from to the inlet of the mass spectrometer 105. In that manner, systems of the invention allow for efficient transfer of ions over long distances (e.g., at least about 5 cm) if required.

Figure 3:
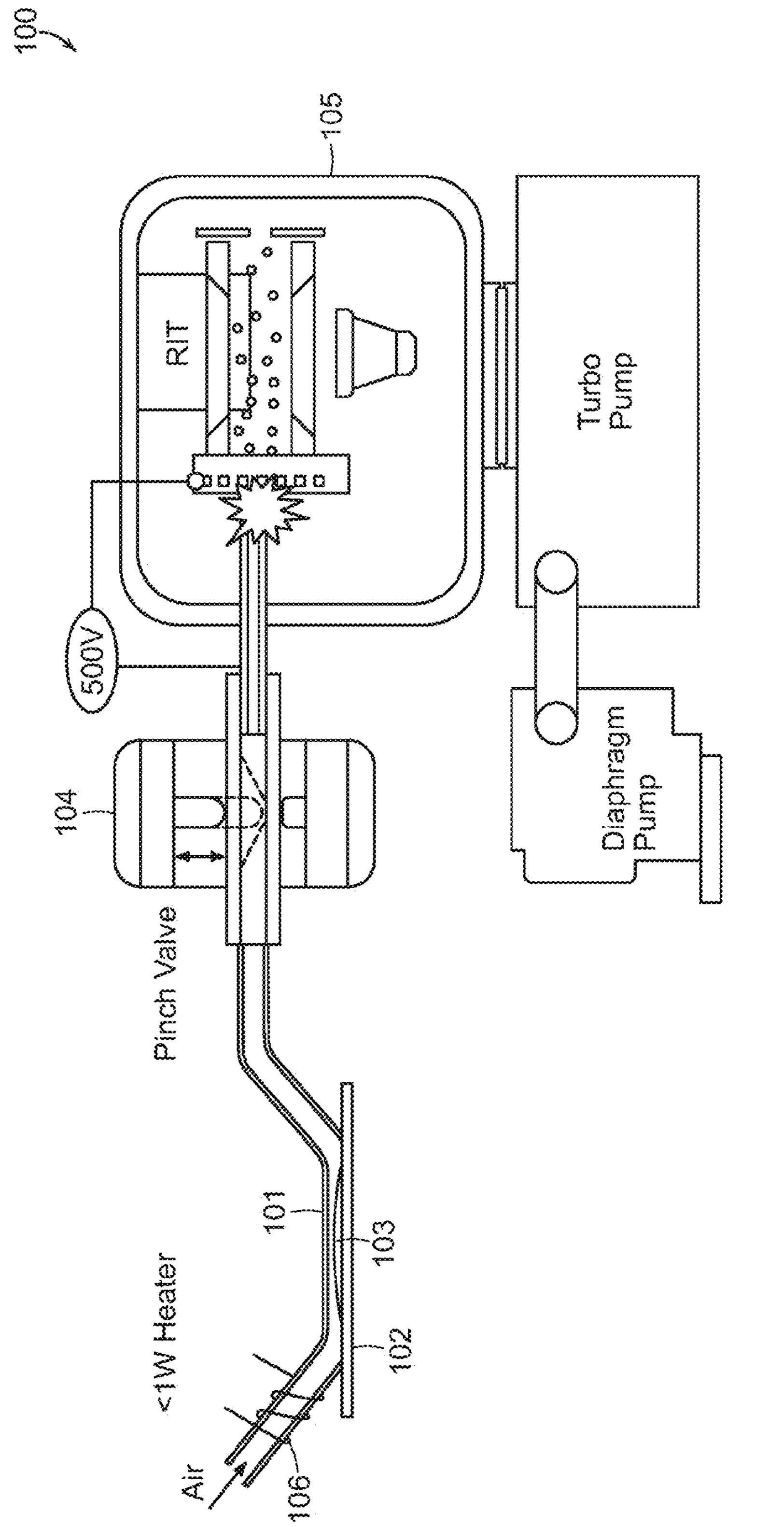
FIG. 3 illustrates an embodiment in which the sample introduction member from the system in FIG. 1 includes a heating element.

FIG. 3 shows an embodiment of system 100 in which sample introduction member 101 includes a heating element 106. Any heating element known in the art may be used with sample introduction member so long as it imparts heat to the gas, such as air, that enters the sample introduction member 101. The exemplary heating element 106 shown in FIG. 3 is a coiled wire. A power of 1 W or less can be applied to the wire. Other exemplary heating elements include heating plates or foils that can be interfaced with the sample introduction member 101. To facilitate heat transfer when a heating element is used, the sample introduction member 101 is preferably composed of a metal or other material that efficiently transfers heat.

The heating element 106 heats the gas that enters the sample introduction member 101 such that a heated gas interacts with the sample 103 on the surface 102. The heated gas facilitates release of molecules or ions from the sample 103 that enter the sample introduction member 101. Heating the sample is particularly useful with non-volatile samples in order to facilitate release of molecules or ions from such non-volatile samples. A heated gas can be used with volatile samples, although it is not as important as volatile samples typically release neutral molecules or ions without the need for heating.

Figure 4:
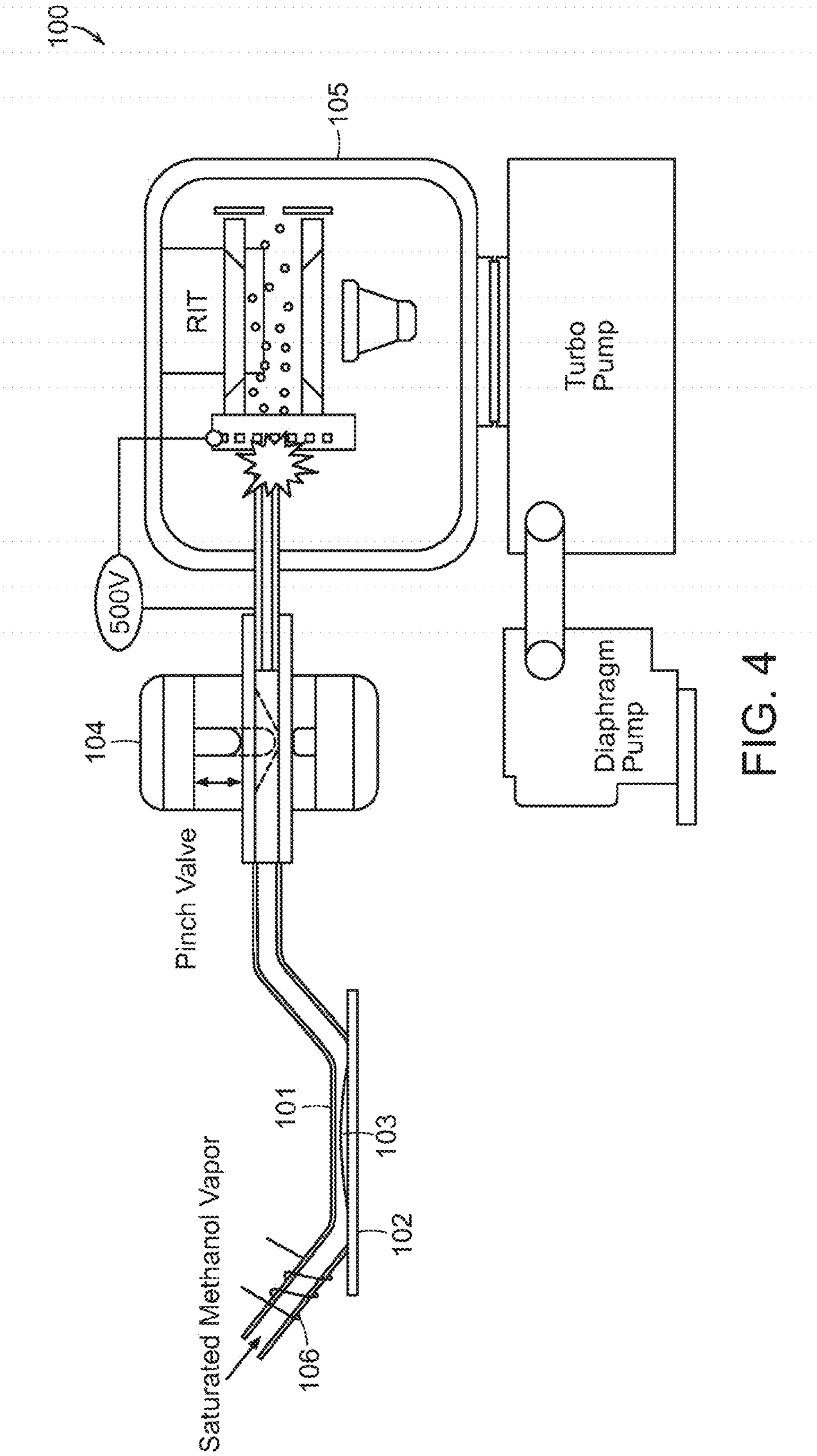
FIG. 4 illustrates an embodiment in which the system in FIG. 1 is used with a saturated methanol vapor.

Systems of the invention are not limited to use with air as the gas that enters the sample introduction member 104. Any type of gas or vapor may be used with systems of the invention and the choice will depend on the sample to be analyzed. For example, FIG. 4 illustrates an embodiment in which a saturated methanol vapor is used with systems of the invention. The gas or vapor can be used with a heating element (as shown in FIG. 4) or without a heating element.

Figure 5:
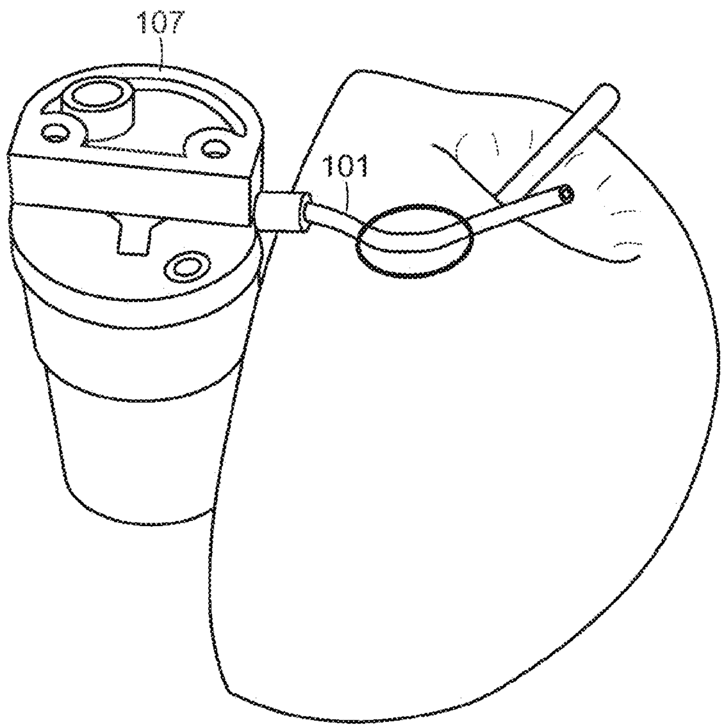
FIG. 5 illustrates an embodiment in which a sample introduction member is coupled to a gas injection apparatus.

FIG. 5 illustrates an embodiment in which a gas or vapor jet 107 is coupled to the sample introduction member 101. The gas or vapor jet allows for the injection of gas or vapor into the sample introduction member 101, thereby increasing the flow rate within the sample introduction member 101. The gas jet 107 is such a device that is capable of generating a gas flow through the sample introduction member 101. The gas injection apparatus 107 facilitates transfer of the neutral molecules or ions from within the sample introduction member 101 to the inlet of the mass spectrometer 105. The gas flow can also assist in the release of molecules or ions from the sample, particularly in the case of non-volatile samples.

Without being limited by any particular theory or mechanism of action, the basic principle is that the gas flow directs gas or vapor into the sample introduction member to form a laminar flow inside the sample introduction member to keep the molecules or ions away from the walls while transferring the molecules or ions through the sample introduction member. The laminar flow is achieved by balancing the incoming and outgoing gas flow. Thus recirculation regions and/or turbulence are avoided. Thus, the generated laminar flow allows for high efficient ion transport over long distance or for sampling of molecules and ions over large distances and areas. This is further described in Ouyang et al. (U.S. Pat. No. 8,410,431), the content of which is incorporated by reference herein in its entirety.

Figure 6:
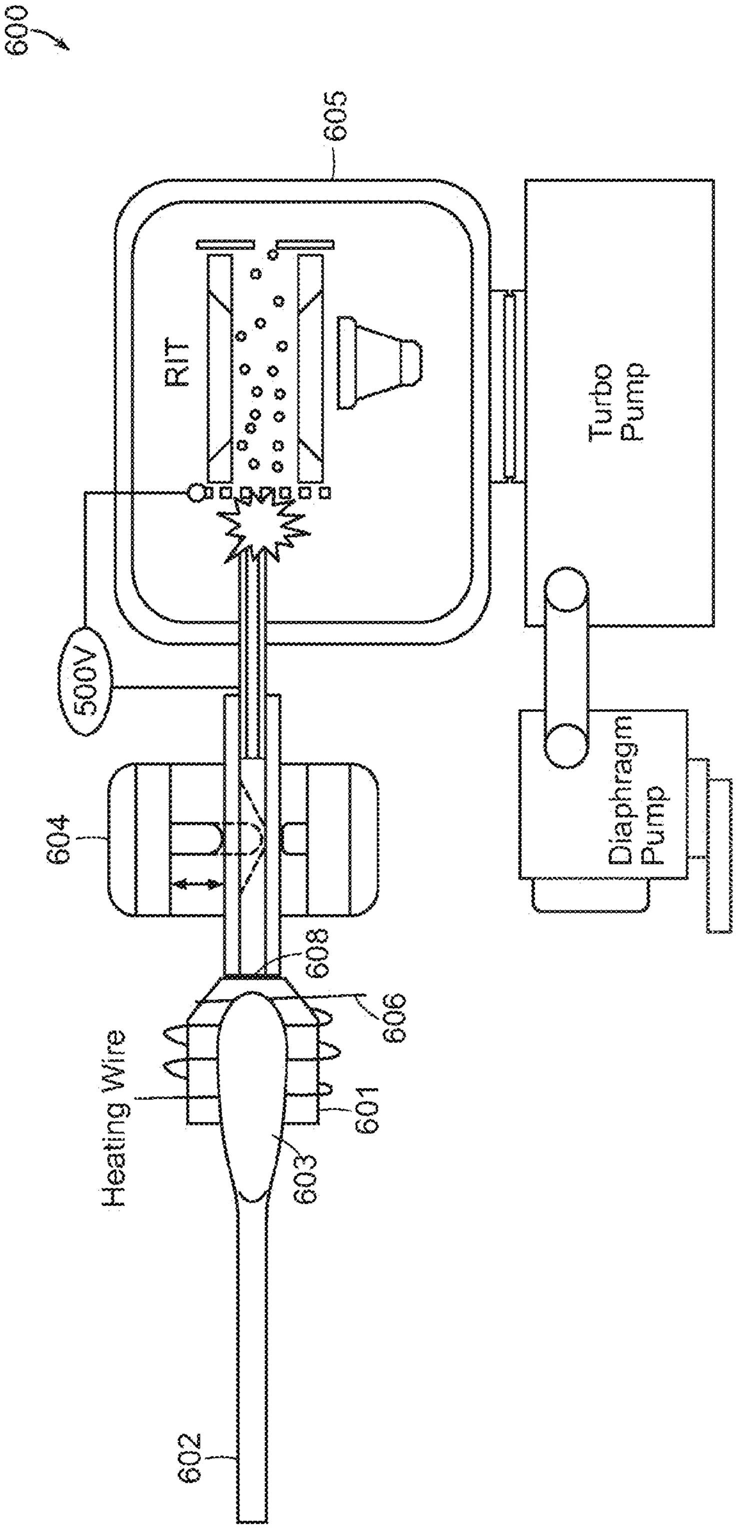
FIG. 6 shows another embodiment of systems of the invention that uses a different configuration of a sample introduction member.

FIG. 6 shows another embodiment of systems of the invention that uses a different configuration of a sample introduction member. The sample introduction member shown in FIG. 6 is configured to interface with a probe and transfer molecules or ions of a sample from the probe into a mass spectrometer. That figure shows a system 600, that includes a sample introduction member 601, coupled to a discontinuous interface 604, which is coupled to a mass spectrometer 605. The discontinuous interface 604 is optional, and in certain embodiments, sample introduction member 601 is coupled directly to mass spectrometer 605. Sample introduction member 601 is configured to interact with a probe, such as probe 602, which includes probe tip 603. Probe tip 603 includes a sample. An advantage of this embodiment is that the probe can be used to interact with a sample at a remote location and then subsequently, the sample can be introduced into the mass spectrometer via the sample introduction member 601. For example, a probe can be swabbed over a surface to collect a sample or dipped in a liquid (such as body fluid sample or environmental sample) to collect a sample. That sample can be in a remote location from the systems of the invention. The probe, now containing sample, is then subsequently interfaced with the systems of the invention via the sample introduction member to analyze the sample in a mass spectrometer. Such embodiments alleviate the need for transfer lines to directly couple the sample to the system, i.e., the sample and the systems of the invention can be remote from each other.

The sample introduction member 601 may be composed of rigid material, such as metal or glass, or may be composed of flexible material such as plastics, rubbers, or polymers. An exemplary flexible material is TYGON.

As shown in FIG. 6, sample introduction member 601 includes a cavity that can receive at least probe tip 603 which includes a sample. Molecules or ions of the sample on the probe tip 603 are transferred, directly or indirectly, via outlet 608 of sample introduction member 601 into mass spectrometer 605 after probe tip 603 has been interfaced with sample introduction member 601, optionally first passing through discontinuous interface 604. If it is ions that enter the mass spectrometer 605, then the ions are immediately analyzed. If it is neutral molecules that enter the mass spectrometer 605, then the neutral molecules are ionized within the mass spectrometer and then analyzed, as described for example in Ouyang et al. (U.S. Pat. No. 8,785,846). When a discontinuous interface is used, the ionization of the neutral molecules can be synchronized with the opening and closing of the discontinuous interface as described for example in Ouyang et al. (U.S. Pat. No. 8,785,846).

As shown in FIG. 6, the body of the sample introduction member 601 tapers to the outlet 608. This tapering is not required, although there are advantages to having the taper. For example, the tapering ensures a tight fit between the probe tip 603 and the sample introduction member 601, ensuring that neutral molecules or ions released from the probe tip 603 are efficiently transferred into the mass spectrometer 605. Space in the cavity between the probe tip 603 and the sample introduction member 601 allows for the possibility that neutral molecules or ions released from the probe tip 603 will escape the cavity of the sample introduction member 601, decreasing the efficiency of the transfer. Additionally, in embodiments that use a heating element, a tight fit between the probe tip 603 and the sample introduction member 601 ensures efficient heat transfer from the sample introduction member 601 to the probe tip 603.

The cavity of sample introduction member 601 can be any size and will depend on the size of the probe to be interfaced with the sample introduction member 601. Exemplary inner diameters of the cavity include 0.1 mm up to 100 mm and any value in between, such as 0.1 mm, 0.2 mm, 0.3 mm, 0.4 mm, 0.5 mm 1 mm, 1.5 mm, 2 mm, 2.5 mm, 3 mm, 3.5 mm 4 mm, 4.5 mm 5 mm, 10 mm, 15 mm, 20 mm, 30 mm 40 mm, 50 mm, 60 mm, 70 mm, 80 mm, 90 mm, or 100 mm. The cavity can have a fixed inner diameter. Alternatively, the sample introduction member 601 can be designed to be adjustable so that the internal diameter of the cavity can be adjusted based on the probe to which it will be interfaced.

The outlet 608 can be any size and will depend on the size of the probe to be interfaced with the sample introduction member 601. Exemplary inner diameters of the outlet 608 include 0.1 mm up to 100 mm and any value in between, such as 0.1 mm, 0.2 mm, 0.3 mm, 0.4 mm, 0.5 mm 1 mm, 1.5 mm, 2 mm, 2.5 mm, 3 mm, 3.5 mm 4 mm, 4.5 mm 5 mm, 10 mm, 15 mm, 20 mm, 30 mm 40 mm, 50 mm, 60 mm, 70 mm, 80 mm, 90 mm, or 100 mm. The cavity can have a fixed inner diameter.

The embodiment shown in FIG. 6 includes a heating element 606. However, the embodiment shown in FIG. 6 does not require the heating element, which is an optional feature, and the sample introduction member 601 can function without the heating element 606. Any heating element known in the art may be used with sample introduction member so long as it imparts heat to the probe tip 603. The exemplary heating element 606 shown in FIG. 6 is a coiled wire. A power of 1 W or less can be applied to the wire. Other exemplary heating elements include heating plates or foils that can be interfaced with the sample introduction member 601. To facilitate heat transfer when a heating element is used, the sample introduction member 601 is preferably composed of a metal or other material that efficiently transfers heat.

The heating element 606 heats the sample introduction member 601, which heat is transferred through sample introduction member 601 to the sample on probe tip 603. The heating facilitates release of molecules or ions from the sample on probe tip 603. Heating the sample is particularly useful with non-volatile samples in order to facilitate release of molecules or ions from such non-volatile samples. Heating can be used with volatile samples, although it is not as important as volatile samples typically release neutral molecules or ions without the need for heating.

Any type of mass spectrometer known in the art can be used with systems and methods of the invention. For example, the mass spectrometer can be a standard bench-top mass spectrometer. In other embodiments, the mass spectrometer is a miniature mass spectrometer. An exemplary miniature mass spectrometer is described, for example in Gao et al. (Z. Anal. Chem. 2006, 78, 5994-6002), the content of which is incorporated by reference herein in its entirety In comparison with the pumping system used for lab-scale instruments with thousands watts of power, miniature mass spectrometers generally have smaller pumping systems, such as a 18 W pumping system with only a 5 L/min (0.3 m3/hr) diaphragm pump and a 11 L/s turbo pump for the system described in Gao et al. Other exemplary miniature mass spectrometers are described for example in Gao et al. (Anal. Chem., 80:7198-7205, 2008), Hou et al. (Anal. Chem., 83:1857-1861, 2011), and Sokol et al. (Int. J. Mass Spectrom., 2011, 306, 187-195), the content of each of which is incorporated herein by reference in its entirety. Miniature mass spectrometers are also described, for example in Xu et al. (JALA, 2010, 15, 433-439); Ouyang et al. (Anal. Chem., 2009, 81, 2421-2425); Ouyang et al. (Ann. Rev. Anal. Chem., 2009, 2, 187-214); Sanders et al. (Euro. J. Mass Spectrom., 2009, 16, 11-20); Gao et al. (Anal. Chem., 2006, 78(17), 5994-6002); Mulligan et al. (Chem. Com., 2006, 1709-1711); and Fico et al. (Anal. Chem., 2007, 79, 8076-8082), the content of each of which is incorporated herein by reference in its entirety.

Systems and methods of the invention can be used with any type of sample, such as organic or non-organic, biological or non-biological, etc. In certain embodiments, the sample is derived from a biological tissue or is a biological fluid, such as blood, urine, saliva, or spinal cord fluid. The sample may include an analyte of interest to be analyzed. That analyte can be native to the sample or may have been introduced into the sample. Exemplary analytes include therapeutic drugs, drugs of abuse and other biomarkers. The examples herein show analysis of therapeutic drugs, drugs of abuse and other compounds. In certain embodiments, systems and methods of the invention can be used for direct analysis of biofluid samples or liquid samples. That is, systems and methods of the invention can be used without performing an sample preparation or purification steps.

Discontinuous Interface (DI) and Synchronization with Ionization

As mentioned above, systems and methods of the invention can optionally involve the use of a discontinuous interface and the ionization of neutral molecules can be synchronized with the operation of the discontinuous interface. Such systems and methods are described for example in Ouyang et al. (U.S. Pat. No. 8,304,718) and Ouyang et al. (U.S. Pat. No. 8,785,846), the content of each of which is incorporated by reference herein in its entirety.

The concept of the DI is to open its channel during ion introduction and then close it for subsequent mass analysis during each scan. An transfer channel with a much bigger flow conductance can be allowed for a DI than for a traditional continuous API. The pressure inside the manifold temporarily increases significantly when the channel is opened for maximum ion introduction. All high voltages can be shut off and only low voltage RF is on for trapping of the ions during this period. After the ion introduction, the channel is closed and the pressure can decrease over a period of time to reach the optimal pressure for further ion manipulation or mass analysis when the high voltages can be is turned on and the RF can be scanned to high voltage for mass analysis.

A DI opens and shuts down the airflow in a controlled fashion. The pressure inside the vacuum manifold increases when the API opens and decreases when it closes. The combination of a DI with a trapping device, which can be a mass analyzer or an intermediate stage storage device, allows maximum introduction of an ion package into a system with a given pumping capacity.

Much larger openings can be used for the pressure constraining components in the API in the new discontinuous introduction mode. During the short period when the API is opened, the trapping device is operated in the trapping mode with a low RF voltage to store the incoming ions; at the same time the high voltages on other components, such as conversion dynode or electron multiplier, are shut off to avoid damage to those device and electronics at the higher pressures. The API can then be closed to allow the pressure inside the manifold to drop back to the optimum value for mass analysis, at which time the molecules are ionized and mass analyzed in the trap or transferred to another mass analyzer within the vacuum system for mass analysis. This two-pressure mode of operation enabled by operation of the API in a discontinuous fashion maximizes ion introduction as well as optimizing conditions for the mass analysis with a given pumping capacity.

The design goal is to have largest opening while keeping the optimum vacuum pressure for the mass analyzer, which is between $10^{-3}$ to $10^{-10}$ torr depending the type of mass analyzer. The larger the opening in an atmospheric pressure interface, the higher is the ion current delivered into the vacuum system and hence to the mass analyzer.

An exemplary embodiment of a DI is shown in FIG. 1. The DI includes a pinch valve that is used to open and shut off a pathway in a silicone tube connecting regions at atmospheric pressure and in vacuum. A normally-closed pinch valve (390NC24330, ASCO Valve Inc., Florham Park, N.J.) is used to control the opening of the vacuum manifold to atmospheric pressure region. Two stainless steel capillaries are connected to the piece of silicone plastic tubing, the open/closed status of which is controlled by the pinch valve. The stainless steel capillary connecting to the atmosphere is the flow restricting element, and has an ID of 250 μm, an OD of 1.6 mm (1/16") and a length of 10 cm. The stainless steel capillary on the vacuum side has an ID of 1.0 mm, an OD of 1.6 mm (1/16") and a length of 5.0 cm. The plastic tubing has an ID of 1/16", an OD of 1/8" and a length of 5.0 cm. One or Both stainless steel capillaries may be grounded. The pumping system of the mini 10 consists of a two-stage diaphragm pump 1091-N84.0-8.99 (KNF Neuberger Inc., Trenton, N.J.) with pumping speed of 5 L/min (0.3 m3/hr) and a TPD011 hybrid turbomolecular pump (Pfeiffer Vacuum Inc., Nashua, N.H.) with a pumping speed of 11 L/s.

When the pinch valve is constantly energized and the plastic tubing is constantly open, the flow conductance is so high that the pressure in vacuum manifold is above 30 torr with the diaphragm pump operating. The ion transfer efficiency was measured to be 0.2%, which is comparable to a lab-scale mass spectrometer with a continuous API. However, under these conditions the TPD 011 turbomolecular pump cannot be turned on. When the pinch valve is de-energized, the plastic tubing is squeezed closed and the turbo pump can then be turned on to pump the manifold to its ultimate pressure in the range of $1\times10^{5}$ torr.

The sequence of operations for performing mass analysis using ion traps usually includes, but is not limited to, ion or molecule introduction, ion or molecule cooling, ionization if molecules are introduced, and RF scanning. After the manifold pressure is pumped down initially, a scan function is implemented to switch between open and closed modes for ion introduction and mass analysis. During the ionization time, a 24 V DC is used to energize the pinch valve and the API is open. The potential on the rectilinear ion trap (RIT) end electrode is also set to ground during this period. A minimum response time for the pinch valve is found to be 10 ms and an ionization time between 15 ms and 30 ms is used for the characterization of the discontinuous API. A cooling time between 250 ms to 500 ms is implemented after the API is closed to allow the pressure to decrease and the ions to cool down via collisions with background air molecules. The high voltage on the electron multiplier is then turned on and the RF voltage is scanned for mass analysis. During the operation of the discontinuous API, the pressure change in the manifold can be monitored using the micro pirani vacuum gauge (MKS 925C, MKS Instruments, Inc. Wilmington, Mass.) on Mini 10 portable system.

In certain embodiments, neutral molecules are introduced into the mass spectrometer and the molecules are ionized within the vacuum changer of the mass spectrometer. In such embodiments, the invention provides systems for analyzing a sample that include an electric source, a vacuum chamber including a conducting member, in which the conducting member is coupled to the electric source, a sample introduction member coupled to the vacuum chamber, in which a distal end of the sample introduction member resides within the vacuum chamber and proximate the conducting member such that an electrical discharge may be produced between the sample introduction member and the conducting member, in which the discharge ionizes molecules of a neutral gas introduced into the vacuum chamber, and a mass analyzer within the vacuum chamber.

FIG. 1 is a schematic showing an embodiment of systems of the invention. This embodiment shows a sample introduction member in which a proximal end of the line resides at atmospheric pressure and a distal end of the line resides in a vacuum chamber. In this manner, a neutral gas may be introduced through the sample introduction member and into the vacuum chamber. The sample introduction member may be made of any material that conducts electricity.

The vacuum chamber includes a mass analyzer and a conducting member that resides within the vacuum chamber. Any mass analyzer known in the art may be used with systems of the invention. Exemplary mass analyzers include a quadrupole ion trap, a rectilinear ion trap, a cylindrical ion trap, a ion cyclotron resonance trap, and an orbitrap. The conducting member is positioned proximate to the distal end of the sample introduction member that also resides in the vacuum chamber. The conducting member is connected to an electric source, such as a DC electric source. In the context of systems of the invention, proximate refers to a position close enough that an electric discharge may be generated between the distal end of the sample introduction member and the conducting member.

In operation, a neutral gas is introduced through the sample introduction member into the vacuum chamber. An electric voltage, such as a DC electric voltage, is applied to the conducting member in the presence of the neutral gas. Due to the proximity of conducting member and the distal end of the sample introduction member, an electric discharge is produced between the conducting member and the distal end of the sample introduction member. Molecules of the neutral gas interact with the discharge to form ions, which are subsequently transferred to the mass analyzer by a combination of the electric discharge and the gas flow.

In the embodiment shown in FIG. 1, the sample introduction member is shown integrated with a discontinuous interface. One of skill in the art will appreciate that the discontinuous interface is an optional component of systems and methods of the invention and that systems and methods of the invention can operate without the use of a discontinuous interface. As discussed above, the discontinuous interface shown in FIG. 1 includes a valve for controlling entry of gas into the vacuum chamber such that the gas is transferred into the mass analyzer in a discontinuous mode. Any valve known in the art may be used. Exemplary valves include a pinch valve, a thin plate shutter valve, leak valve, and a needle valve. The atmospheric pressure interface may further include a tube, in which an exterior portion of the tube is aligned with the valve. Generally, two stainless steel capillaries are connected to the piece of silicone plastic tubing, the open/closed status of which is controlled by the pinch valve.

As shown in FIG. 1, a pulse of gas can be introduced into the vacuum to result in an increase of the pressure inside the vacuum. The discontinuous interface is closed and a voltage is applied within the vacuum chamber. By applying a DC voltage between the metal capillary of the discontinuous interface and a metal mesh, discharge occurs when the pressure is higher than a certain value which ionizes the analyte molecules in the gas sample. The ions are transferred into the mass analyzer, by the gas flow and the electric field, and trapped for mass analysis. After the valve is opened, the pressure increases and the discharge stops automatically. The ionization process is synchronized with the sample introduction. The minimum pressure for the discharge is dependent on the electric field and the type of gas, which can be determined with Paschen's curves for the different gases.

INCORPORATION BY REFERENCE

References and citations to other documents, such as patents, patent applications, patent publications, journals, books, papers, web contents, have been made throughout this disclosure. All such documents are hereby incorporated herein by reference in their entirety for all purposes.

EQUIVALENTS

Various modifications of the invention and many further embodiments thereof, in addition to those shown and described herein, will become apparent to those skilled in the art from the full contents of this document, including references to the scientific and patent literature cited herein. The subject matter herein contains important information, exemplification and guidance that can be adapted to the practice of this invention in its various embodiments and equivalents thereof.

EXAMPLES

The Examples herein show analysis of different compounds using the different system set-ups described above. Details of the compounds analyzed is shown in Table 1.

TABLE 1

| Name | Category | Molecular Weight | Vapor pressure | Ion formation |
|---|---|---|---|---|
| Trinitrotoluene (TNT) | Explosives | 227.13 | $1.99 \times 10^{-4}$ Torr (20° C.) | Negative radicals |
| Fenitrothion | Pesticide | 277.23 | $5.4 \times 10^{-5}$ Torr (20° C.) | Negative radicals |
| Parathion-methyl | Pesticide | 263.2 | $9.7 \times 10^{-6}$ Torr (20° C.) | Negative radicals |
| Malathion | Pesticide | 330.35 | $8 \times 10^{-6}$ Torr (20° C.) | Negative radicals |
| Tetryl | Explosives | 287.15 | $1.2 \times 10^{-7}$ Torr (25° C.) | Negative radicals |
| Ketamine | Illicit Drug | 237.72 | $1.76 \times 10^{-5}$ Torr (25° C.) | Protonated ion |

TABLE 1-continued

| Name | Category | Molecular Weight | Vapor pressure | Ion formation |
|---|---|---|---|---|
| Atrazine | Pesticide | 215.68 | $2.78 \times 10^{-7}$ Torr (20° C.) | Protonated ion |
| Cocaine | Illicit Drug | 303.35 | $8.88 \times 10^{-8}$ Torr (20° C.) | Protonated ion |

Example 1: Analysis of Compounds Using Air Flow

Figure 7:
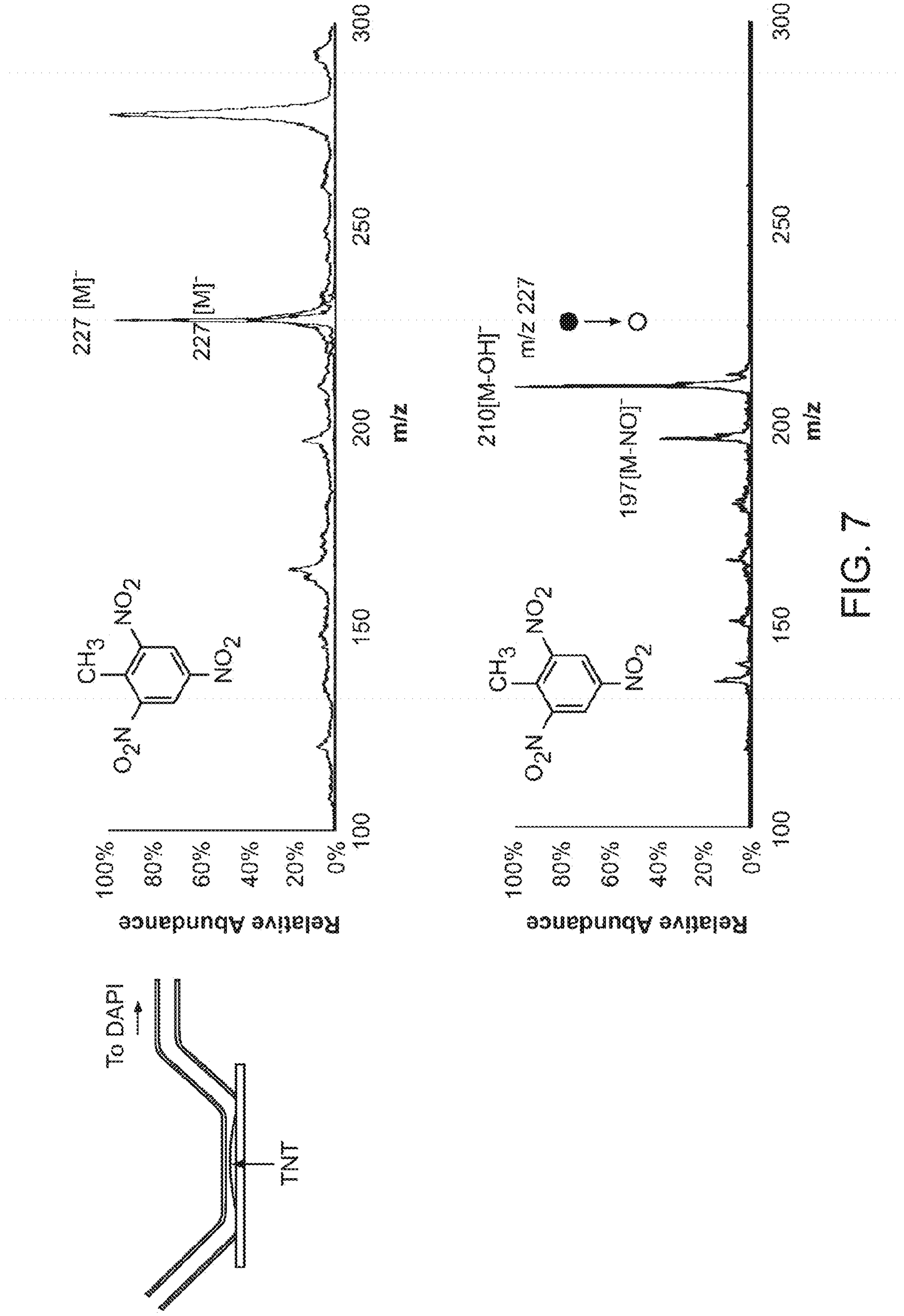
FIG. 7 shows the analysis of TNT from a surface using a system set-up as shown in FIG. 1.
Figure 8:
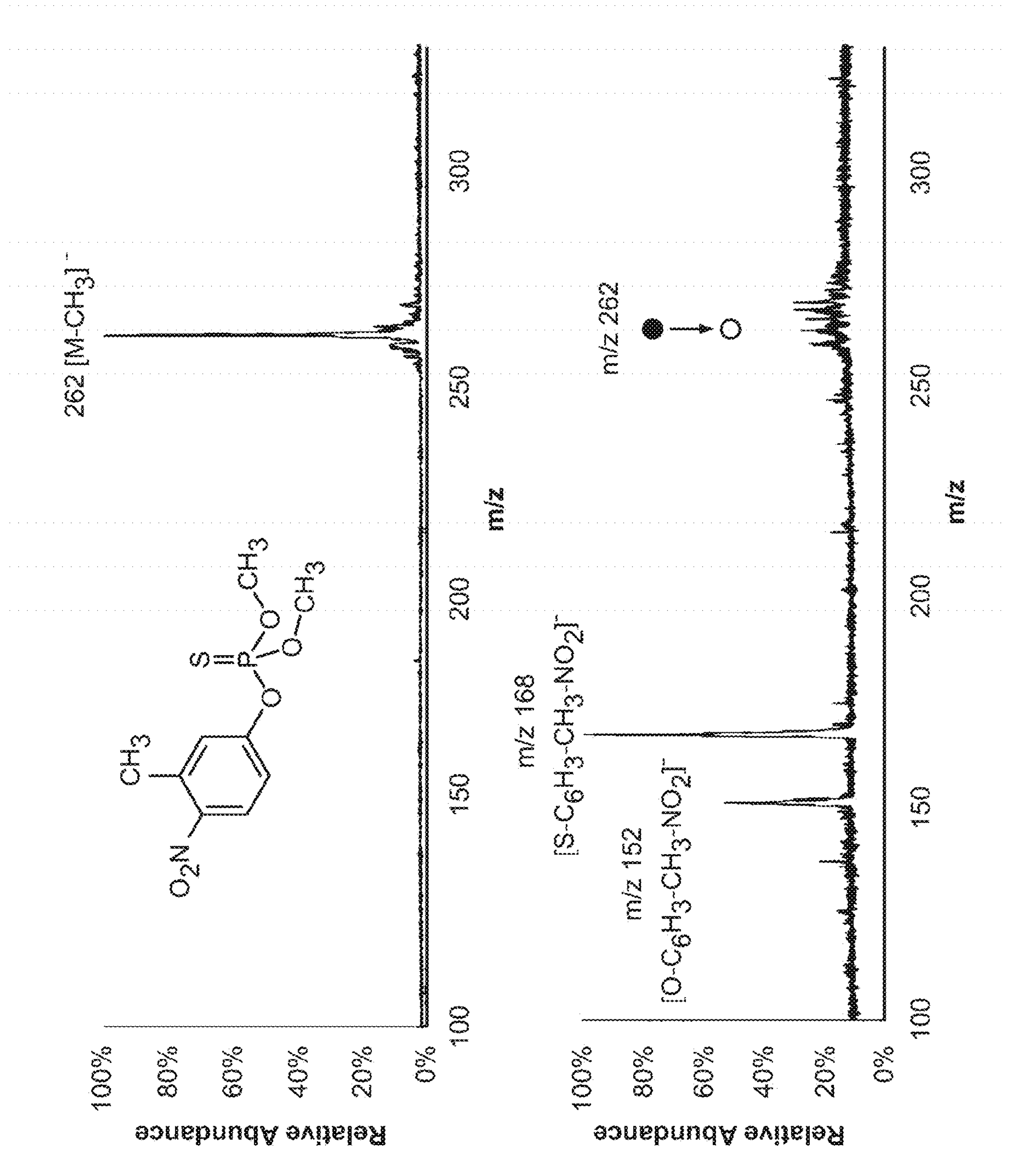
FIG. 8 shows the analysis of fenitrothion from a surface using a system set-up as shown in FIG. 1.
Figure 9:
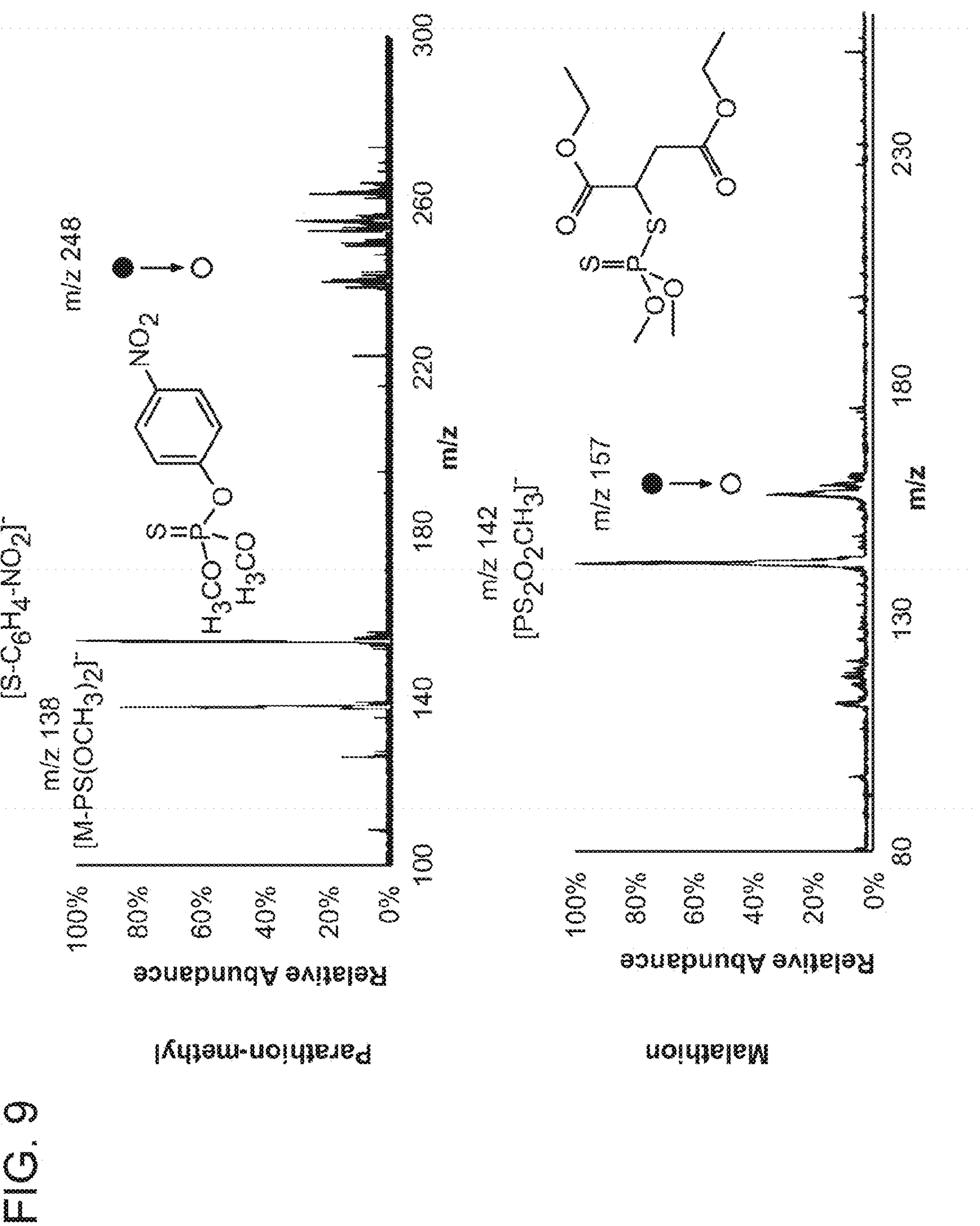
FIG. 9 shows the analysis of each of parathion-methyl and malathion from a surface using a system set-up as shown in FIG. 1.

A system set-up as shown in FIG. 1 was used to analyze different compounds from a surface. FIG. 7 shows the analysis of TNT from a surface using a system set-up as shown in FIG. 1. 300 ng of TNT was spotted on a PTFE surface. A sample introduction member as shown in FIG. 1 was placed on the surface such that the opening interfaced with the surface location that contained the spot of TNT. TNT molecules were released from the surface, flowed through the sample introduction member, and through the discontinuous interface when it was opened. The discontinuous interface was closed, the TNT molecules were ionized within the vacuum chamber to produce ions and the ions were mass analyzed (FIG. 7). Fenitrothion was analyzed in the same manner, and the results are shown in FIG. 8. Parathion-methyl and malathion were also analyzed in that same manner, and the results are shown in FIG. 9.

Example 2: Analysis of Compounds Using a Heated Air Flow

Figure 10:
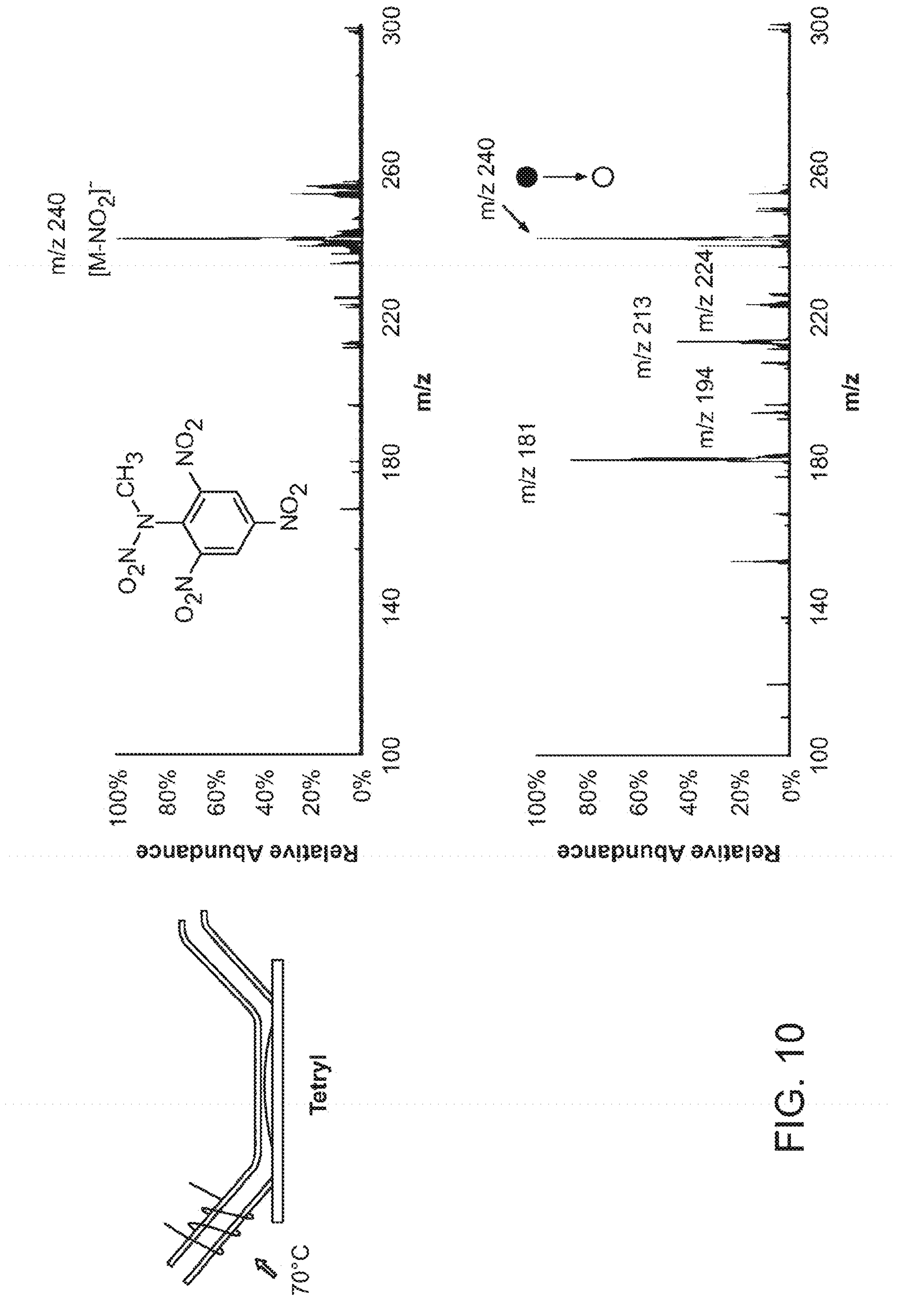
FIG. 10 shows the analysis of tetryl from a surface using a system set-up as shown in FIG. 3.

A system set-up as shown in FIG. 3 was used to analyze different compounds from a surface. FIG. 10 shows the analysis of tetryl from a surface using a system set-up as shown in FIG. 3. 300 ng of tetryl was spotted on a PTFE surface. A sample introduction member with a heating element as shown in FIG. 3 was placed on the surface such that the opening interfaced with the surface location that contained the spot of tetryl. The portion of the sample introduction member that included the heating element was heated to 70° C., which heated the air that entered the sample introduction member. Tetryl molecules were released from the surface, flowed through the sample introduction member, and through the discontinuous interface when it was opened. The discontinuous interface was closed, the tetryl molecules were ionized within the vacuum chamber to produce ions and the ions were mass analyzed (FIG. 10).

Figure 11:
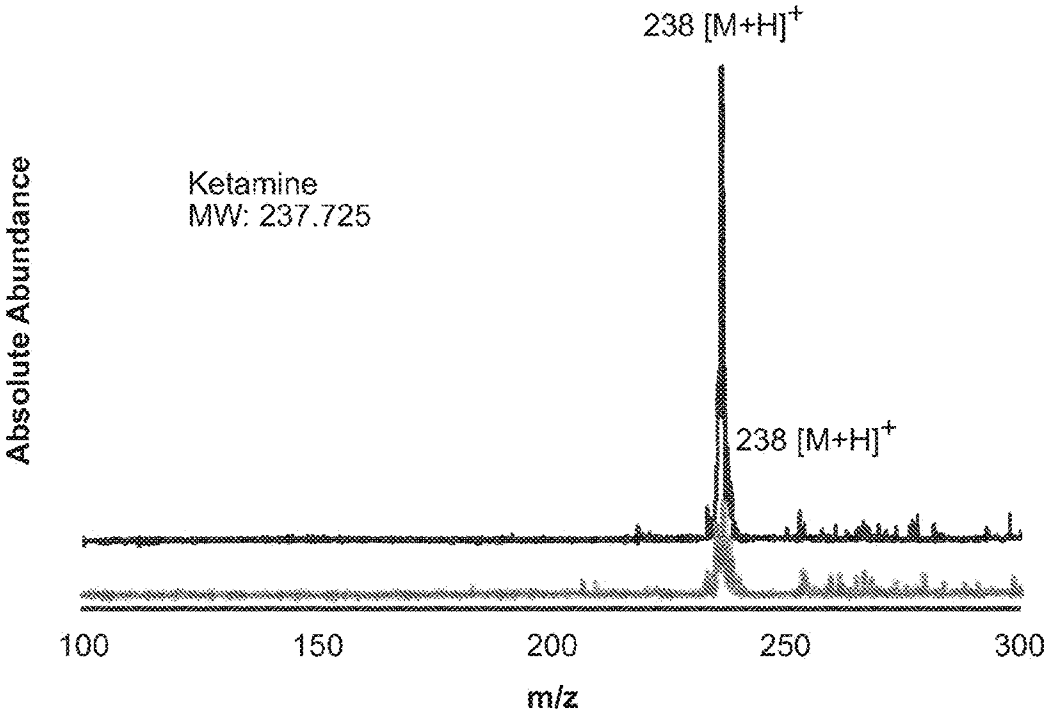
FIG. 11 shows the analysis of ketamine from a surface using a system set-up as shown in FIG. 4.
Figure 12:
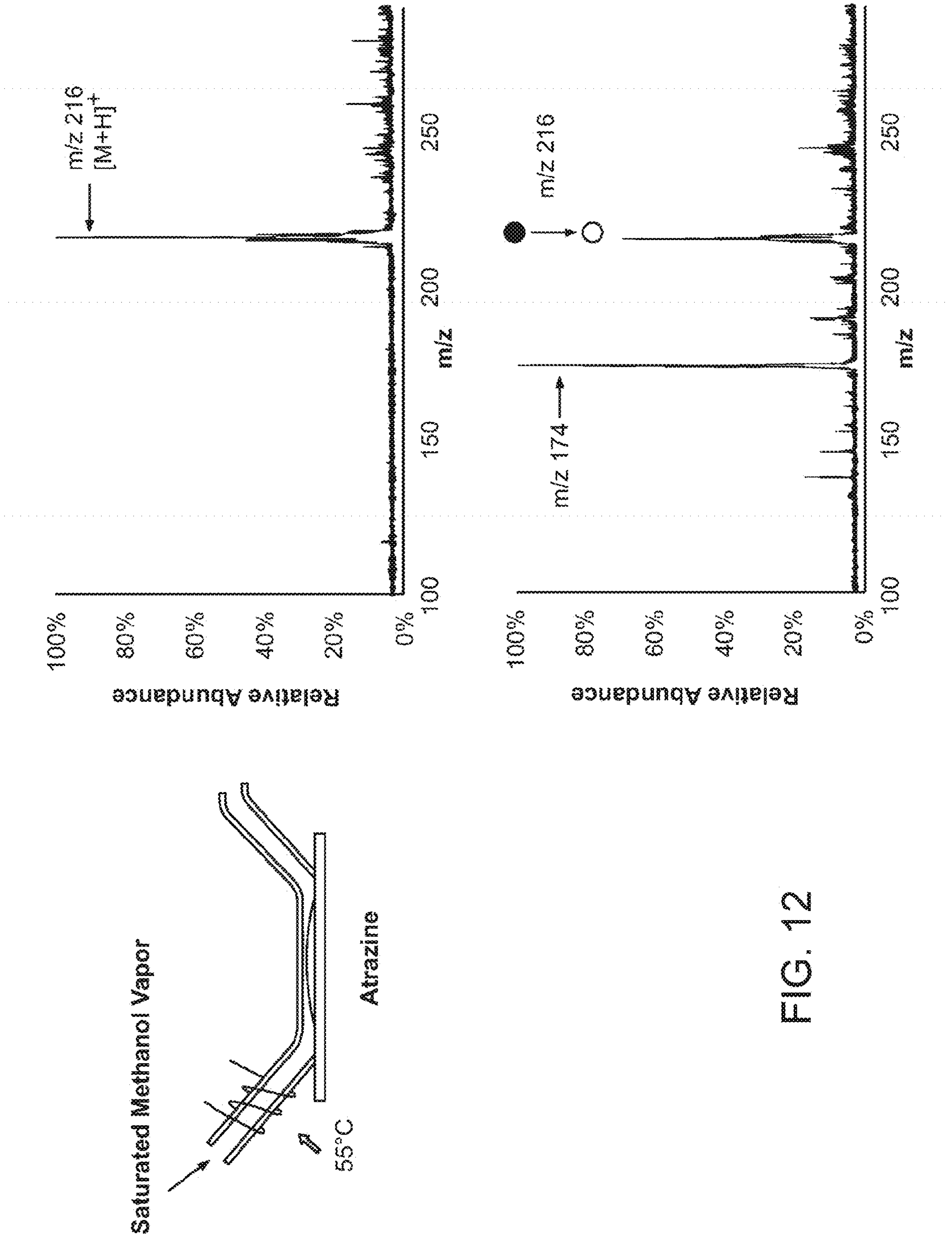
FIG. 12 shows the analysis of atrazine from a surface using a system set-up as shown in FIG. 4.
Figure 13:
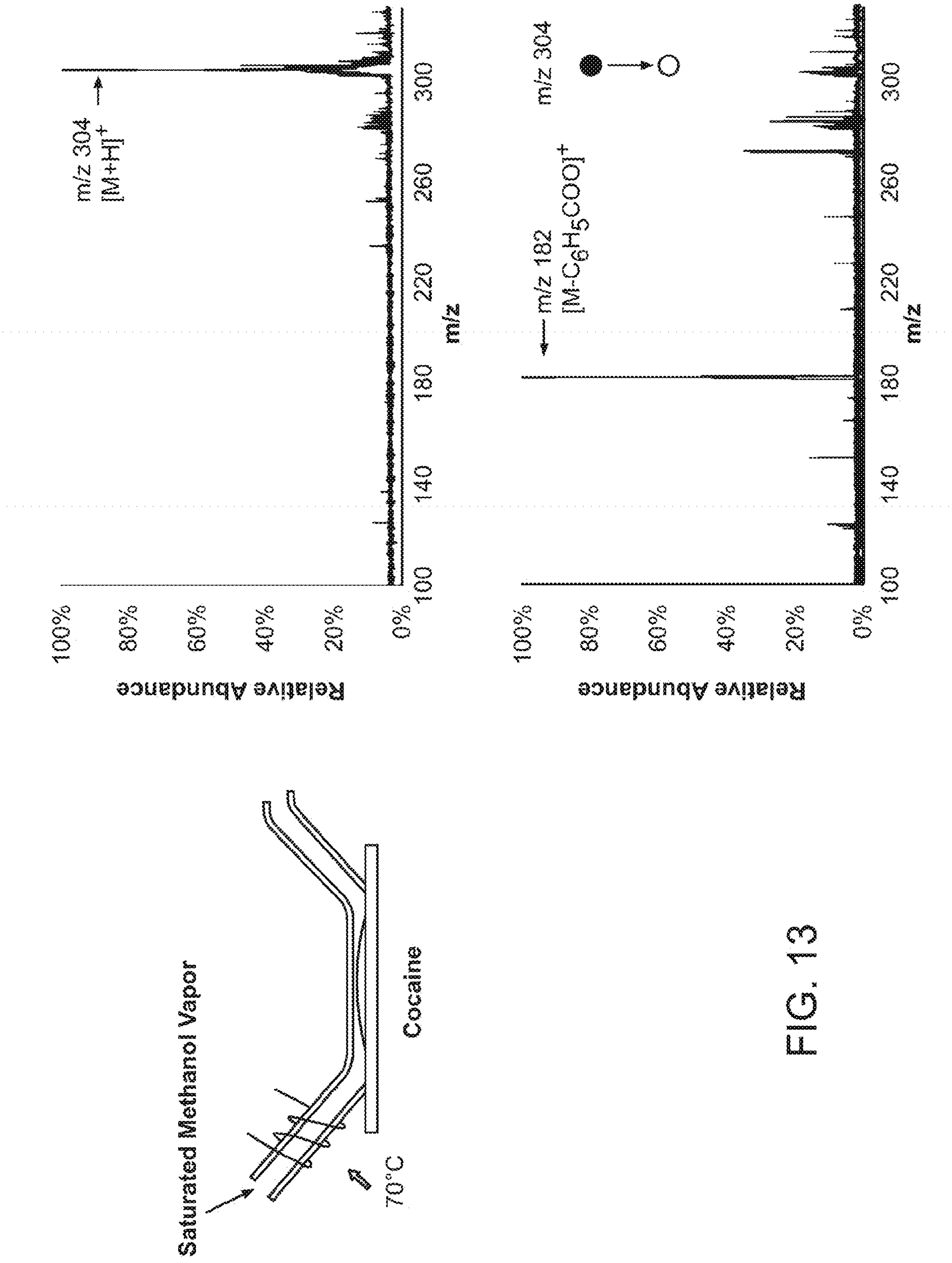
FIG. 13 shows the analysis of cocaine from a surface using a system set-up as shown in FIG. 4.

Example 3: Analysis of Compounds Using a Heated Flow of Saturated Methanol Vapor A system set-up as shown in FIG. 4 was used to analyze different compounds from a surface. FIG. 11 shows the analysis of ketamine from a surface using a system set-up as shown in FIG. 4. Ketamine was spotted on a PTFE surface. A sample introduction member with a heating element as shown in FIG. 4 was placed on the surface such that the opening interfaced with the surface location that contained the spot of tetryl. A saturated methanol vapor was introduced into the sample introduction member while the portion of the sample introduction member that included the heating element was heated to 70° C., which heated the saturated methanol vapor that entered the sample introduction member. Ketamine molecules were released from the surface, flowed through the sample introduction member, and through the discontinuous interface when it was opened. The discontinuous interface was closed, the ketamine molecules were ionized within the vacuum chamber to produce ions and the ions were mass analyzed (FIG. 11). Atrazine was analyze in a similar manner, except 600 ng was spotted onto the PTFE surface and the heating element was heated to 55° C. The results of that analysis are shown in FIG. 12. Cocaine was analyze in a similar manner, except 600 ng was spotted onto the PTFE surface and the heating element was heated to 70° C. The results of that analysis are shown in FIG. 13.

Example 4: Analysis of Compounds Using a Gas Injection Apparatus

Figure 14:
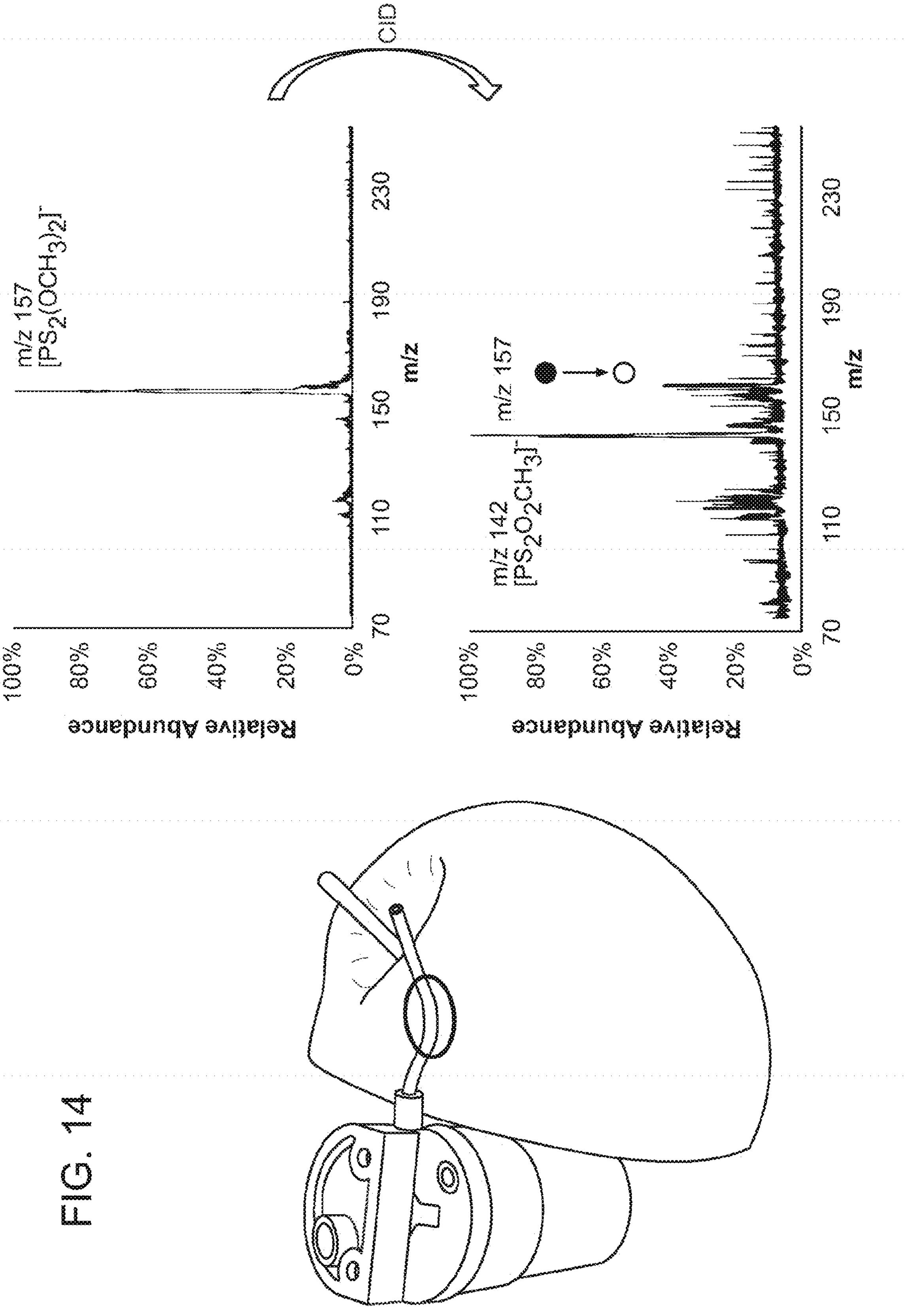
FIG. 14 shows the analysis of malathion from a surface of an apple using a system set-up as shown in FIG. 5.

A system set-up as shown in FIG. 5 was used to analyze 500 ng of malathion spiked onto a surface of an apple, results shown in FIG. 14. 500 ng of malathion was spotted on a surface of an apple. A sample introduction member was placed on the surface such that the opening interfaced with the surface location that contained the malathion. A portable gas injection apparatus was coupled to the inlet of the sample introduction member and a gas was injected from the gas injection apparatus into and through the sample introduction member. Malathion molecules were released from the surface and flowed through the sample introduction member and through the discontinuous interface when it was opened. The discontinuous interface was closed, the malathion molecules were ionized within the vacuum chamber to produce ions and the ions were mass analyzed (FIG. 14).

Example 5: Analysis of Compounds from a Probe

Figure 15:
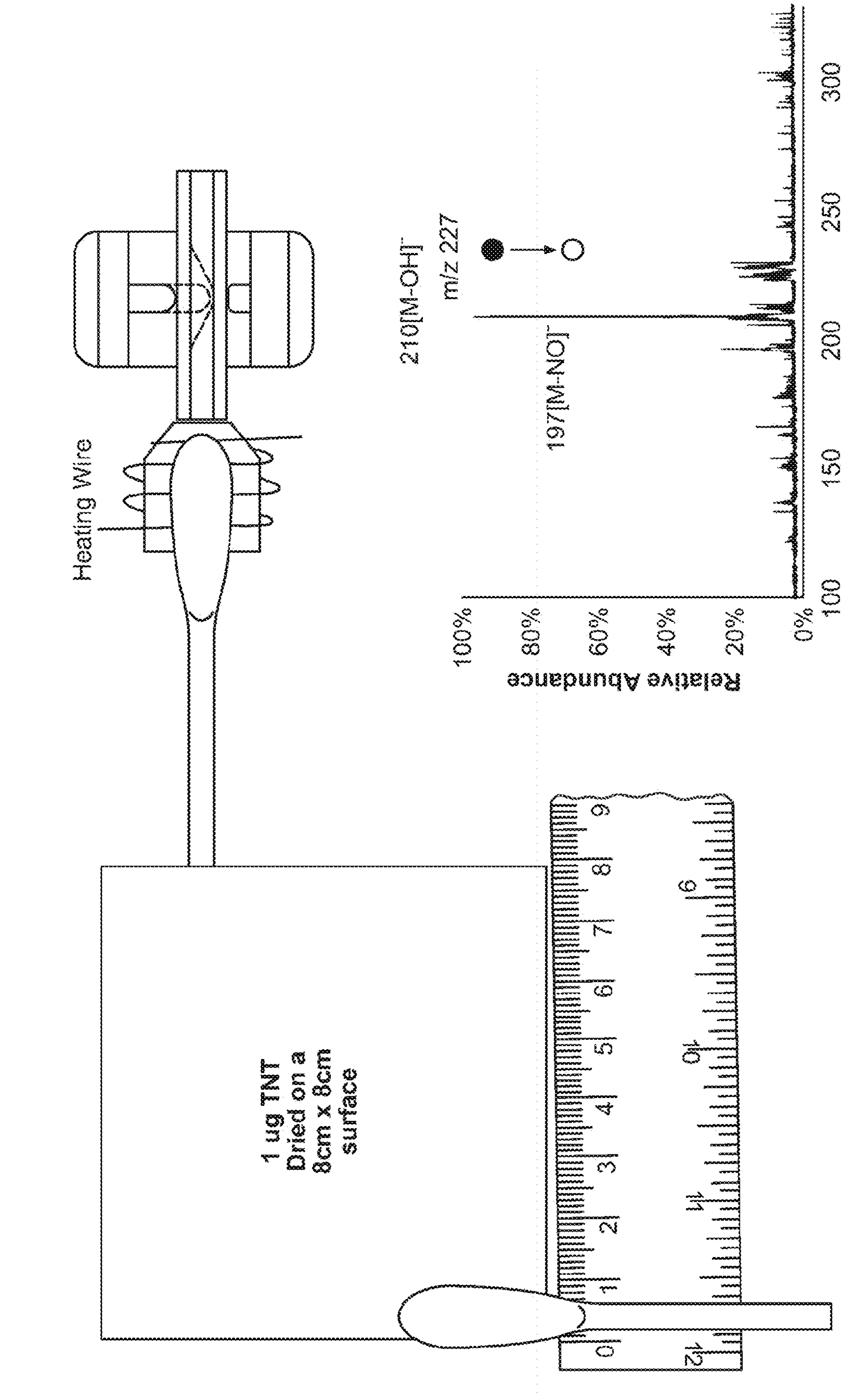
FIG. 15 shows the analysis of TNT from a probe using a system set-up as shown in FIG. 6.

A system set-up as shown in FIG. 6 was used to analyze different compounds from a probe. FIG. 15 shows the analysis of TNT from a probe tip that had been used to swab a surface that contained TNT a system set-up as shown in FIG. 6. 1 μg of TNT was dried on a 8 cm×8 cm surface. A cotton tipped probe was swabbed along the surface and TNT was transferred from the surface onto the probe tip. The probe was interfaced with the sample introduction member such that the probe tip was within the cavity of the sample introduction member. A heating element was wrapped around the sample introduction member. TNT molecules were released from the probe tip, flowed through the outlet of the sample introduction member, and through the discontinuous interface when it was opened. The discontinuous interface was closed, the TNT molecules were ionized within the vacuum chamber to produce ions and the ions were mass analyzed (FIG. 15).

What is claimed is:

1. A system for analyzing a sample, the system comprising:

a monolithic sample introduction member comprising an inlet, an outlet, and an opening along a wall of the sample introduction member that is separate from the inlet, the sample introduction member being configured such that the opening couples via direct contact with a surface that comprises a sample in a manner in which molecules of the sample are desorbed from the surface and enter the sample introduction member via the opening and exit the sample introduction member via the outlet as a result of gas or vapor flow within the monolithic sample introduction member; and a mass spectrometer configured to receive the molecules of the sample.

2. The system according to claim 1, wherein the mass spectrometer comprises an ionization source within a vacuum chamber of the mass spectrometer.

3. The system according to claim 2, further comprising a discontinuous interface positioned between the outlet and the mass spectrometer.

4. The system according to claim 2, wherein the monolithic sample introduction member further comprising a heating element.

5. The system according to claim 1, wherein the mass spectrometer is a miniature mass spectrometer.

6. The system according to claim 1, wherein the monolithic sample introduction member comprises a tube.

7. The system according to claim 5, wherein the tube comprises a central portion, a proximal portion, and a distal portion, wherein the central portion comprises the opening along the wall and the proximal and distal portions are bent with respect to the central portion.

8. The system according to claim 7, wherein the opening along the wall is along a bottom of the central portion.

9. The system according to claim 8, wherein the bottom of the central portion is flat.

10. The system according to claim 7, further comprising a heating coil wrapped around the proximal portion.

11. The system according to claim 6, wherein the tube is a metal tube.

12. The system according to claim 1, further comprising a gas or vapor injection apparatus that couples to the inlet of the monolithic sample introduction member.

13. A system for analyzing a sample, the system comprising:

a monolithic sample introduction member comprising a cavity configured to receive a probe that comprises a sample and an outlet through which molecules of the sample flow upon being released from the probe;

a heating element operably coupled to the sample introduction member such that heat is transferred to a portion of the probe within the cavity in a manner that facilitates release of molecules of the sample from the probe, which molecules flow through the outlet as a result of gas or vapor flow within the monolithic sample introduction member; and a mass spectrometer configured to receive the molecules of the sample.

14. The system according to claim 13, wherein the mass spectrometer comprises an ionization source within a vacuum chamber of the mass spectrometer.

15. The system according to claim 14, further comprising a discontinuous interface positioned between the outlet and the mass spectrometer.

16. The system according to claim 13, wherein the heating element is a coil that wraps around the monolithic sample introduction member.

17. The system according to claim 13, wherein the mass spectrometer is a miniature mass spectrometer.

18. The system according to claim 13, wherein the probe comprises a cotton tip and the monolithic sample introduction member is configured to receive the cotton tip.

19. The system according to claim 13, wherein the monolithic sample introduction member is metal.

20. The system according to claim 19, wherein the monolithic sample introduction member tapers to the outlet.

* * * * *